(12) United States Patent
Koskenmaki et al.

(10) Patent No.: US 6,929,849 B2
(45) Date of Patent: Aug. 16, 2005

(54) EMBEDDED ELECTRICAL TRACES

(75) Inventors: David C. Koskenmaki, Pine Mountain Club, CA (US); Michael N. Miller, Austin, TX (US); Naiyong Jing, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 63 days.

(21) Appl. No.: 10/442,396

(22) Filed: May 21, 2003

(65) Prior Publication Data

US 2003/0196830 A1 Oct. 23, 2003

Related U.S. Application Data

(62) Division of application No. 09/941,058, filed on Aug. 28, 2001, now Pat. No. 6,591,496.

(51) Int. Cl.[7] .............................. B32B 3/00; H05K 1/00
(52) U.S. Cl. ....................... 428/209; 428/901; 174/250; 174/251
(58) Field of Search ................................ 174/250–251; 428/209, 901

(56) References Cited

U.S. PATENT DOCUMENTS

| | | | |
|---|---|---|---|
| 2,961,746 A | * | 11/1960 | Lyman .......................... 29/848 |
| 2,963,748 A | | 12/1960 | Young |
| 3,075,280 A | | 1/1963 | Jack et al. |
| 3,247,579 A | | 4/1966 | Cattermole |
| 3,434,939 A | * | 3/1969 | Brown et al. ................ 205/125 |
| 3,800,020 A | | 3/1974 | Parfet |
| 3,851,382 A | * | 12/1974 | Stork .......................... 438/416 |
| 3,891,514 A | | 6/1975 | Klemm |
| 3,932,927 A | | 1/1976 | Grenon et al. |
| 3,952,152 A | | 4/1976 | Lill et al. |
| 4,179,797 A | | 12/1979 | Johnson |
| 4,321,296 A | | 3/1982 | Rougier |
| 4,381,421 A | | 4/1983 | Coats et al. |
| 4,412,255 A | | 10/1983 | Kuhlman et al. |
| 4,455,481 A | | 6/1984 | Van Hoof et al. |

(Continued)

FOREIGN PATENT DOCUMENTS

| | | |
|---|---|---|
| CH | 585 611 | 3/1977 |
| GB | 993984 | 6/1965 |
| GB | 2033667 | 5/1980 |
| JP | 03003292 | 1/1991 |
| WO | WO 8403586 | 9/1984 |
| WO | WO 8501231 | 3/1985 |
| WO | WO 9639260 | 12/1996 |
| WO | WO 9837133 | 8/1998 |

Primary Examiner—Cathy F. Lam

(57) ABSTRACT

A method for making a fine electrically conductive grid embedded in a polymer substrate. The method includes the steps of providing a polymer substrate, forming a pattern of grooves in the substrate, filling the grooves with electrically conductive powder, and then applying heat and/or pressure to the substrate. The application of heat and/or pressure to the substrate causes the grooves to collapse inward against the conductive powder. Collapsing the grooves compacts the conductive powder within the groove, thereby establishing a continuously conductive grid line or circuit. The narrow grid lines that result allow more light to transmit through the substrate. The method allows grid lines to be made with higher aspect ratios (ratio of line depth to line width) than is possible by previous methods.

13 Claims, 10 Drawing Sheets

U.S. PATENT DOCUMENTS

| | | | |
|---|---|---|---|
| 4,510,347 A | | 4/1985 | Wiech, Jr. |
| 4,519,877 A | | 5/1985 | Wiech, Jr. |
| 4,604,678 A | * | 8/1986 | Hagner ........................ 361/761 |
| 4,614,837 A | | 9/1986 | Kane et al. |
| 4,693,783 A | | 9/1987 | Poppert et al. |
| 4,748,130 A | | 5/1988 | Wenham et al. |
| 4,755,415 A | | 7/1988 | Iijima et al. |
| 4,759,965 A | * | 7/1988 | Kato et al. .................. 428/138 |
| 4,985,601 A | | 1/1991 | Hagner |
| 4,997,674 A | | 3/1991 | Parr et al. |
| 5,055,637 A | | 10/1991 | Hagner |
| 5,059,485 A | | 10/1991 | Parr et al. |
| 5,061,438 A | | 10/1991 | Lillie et al. |
| 5,094,811 A | | 3/1992 | Kane et al. |
| 5,169,488 A | | 12/1992 | Giuffre et al. |
| 5,369,881 A | | 12/1994 | Inaba et al. |
| 5,462,624 A | | 10/1995 | Kwon |
| 5,481,400 A | | 1/1996 | Borden |
| 5,595,943 A | | 1/1997 | Itabashi et al. |
| 5,731,086 A | | 3/1998 | Gebhardt et al. |
| 5,745,989 A | | 5/1998 | Fisher et al. |
| 5,761,801 A | | 6/1998 | Gebhardt et al. |
| 5,846,854 A | | 12/1998 | Giraud et al. |
| 5,858,496 A | | 1/1999 | Fisher et al. |
| 5,908,585 A | | 6/1999 | Shibuta |
| 5,928,767 A | | 7/1999 | Gebhardt et al. |
| 6,103,033 A | | 8/2000 | Say et al. |
| 6,103,640 A | | 8/2000 | Yoshikawa et al. |
| 6,117,781 A | * | 9/2000 | Lukanc et al. ............... 438/692 |
| 6,841,228 B2 | * | 1/2005 | Edwards et al. ............ 428/209 |

* cited by examiner

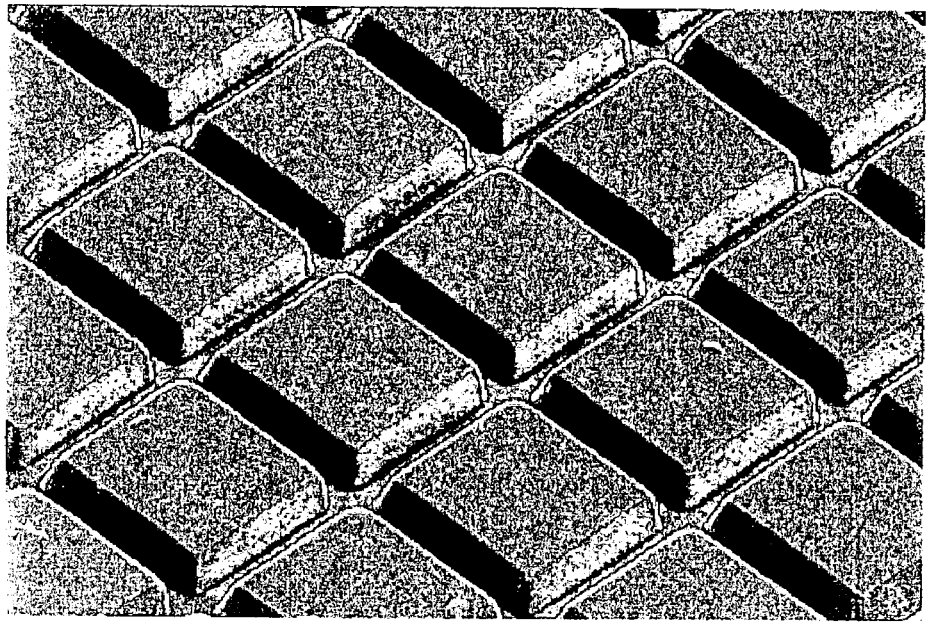
FIG. 1  100 μm
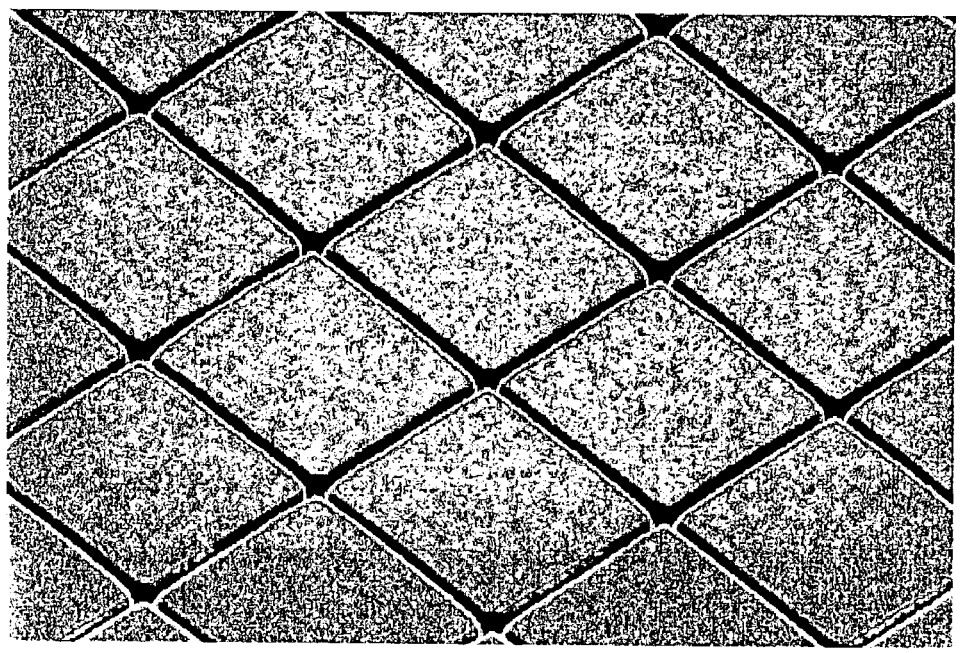
FIG. 2  100 μm

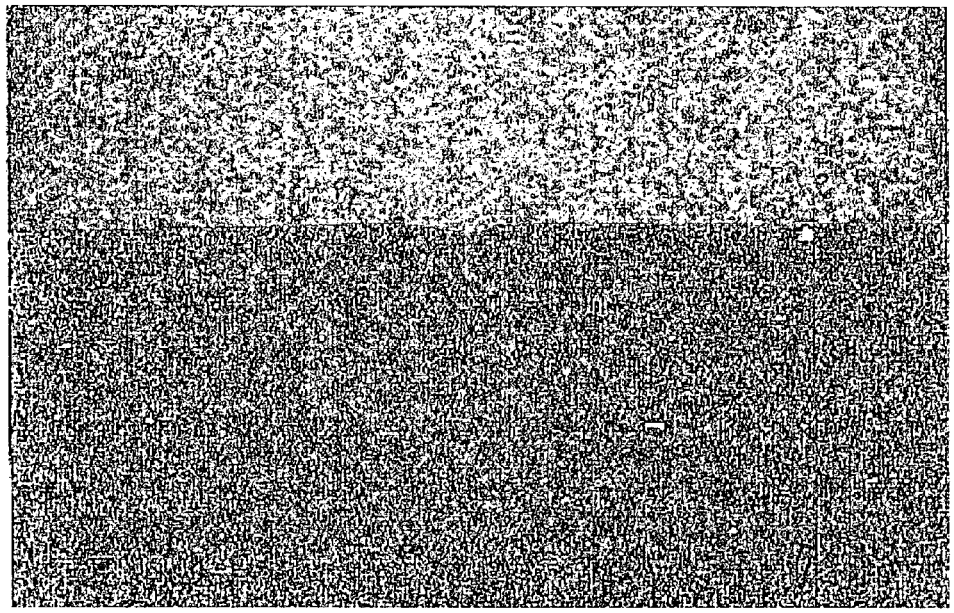
FIG. 7  10 μm
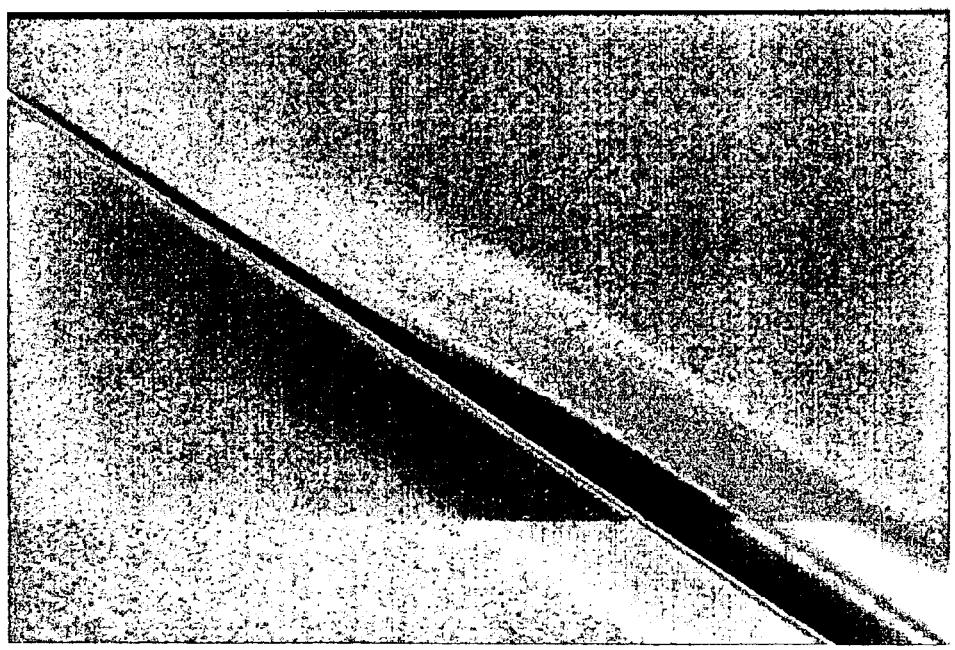
FIG. 8  10 μm

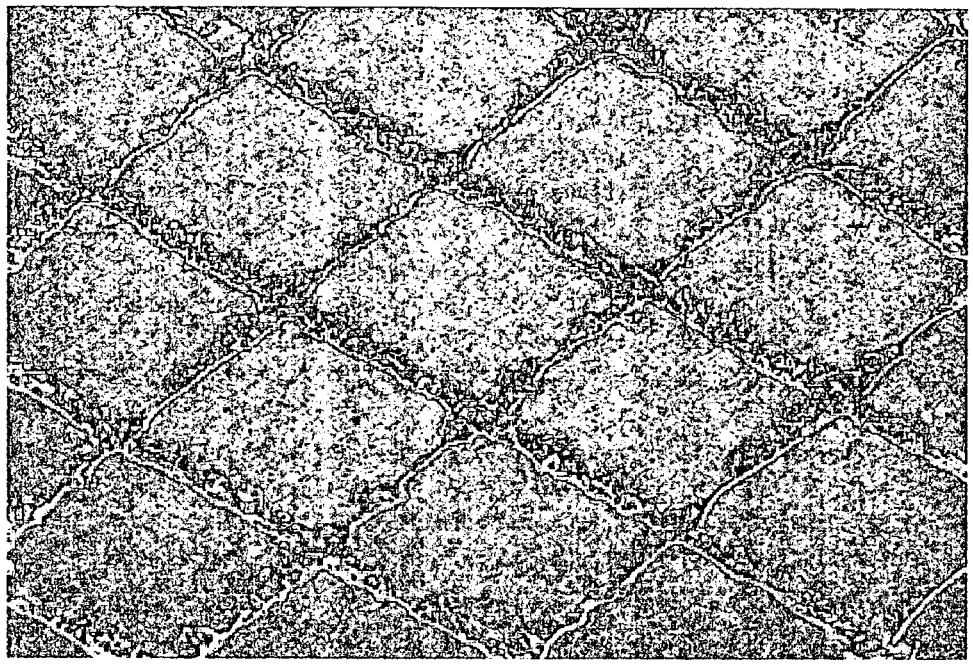
FIG. 9  100 μm
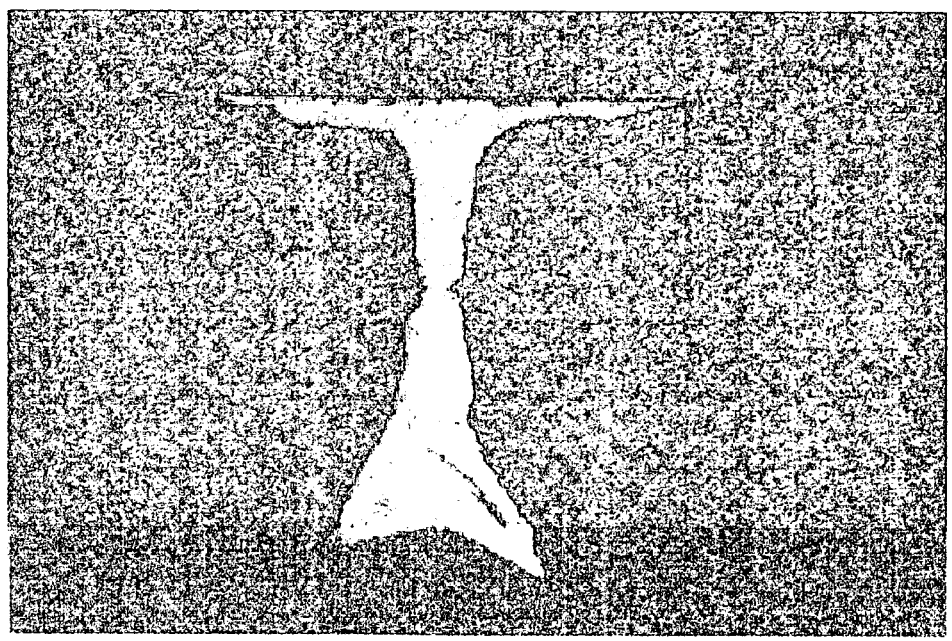
FIG. 10  10 μm

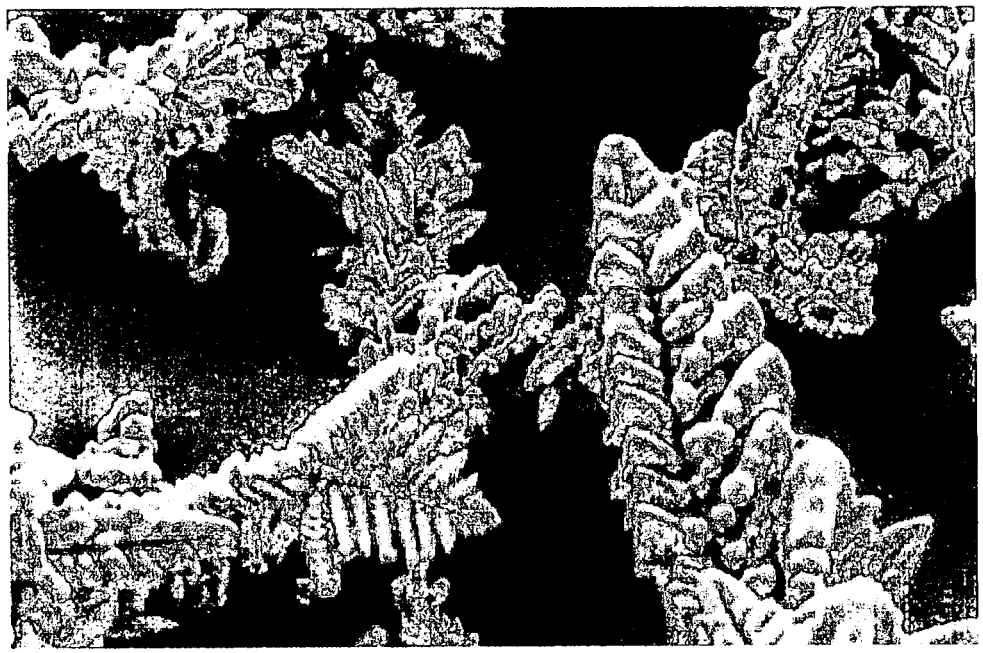
FIG. 11  10 μm
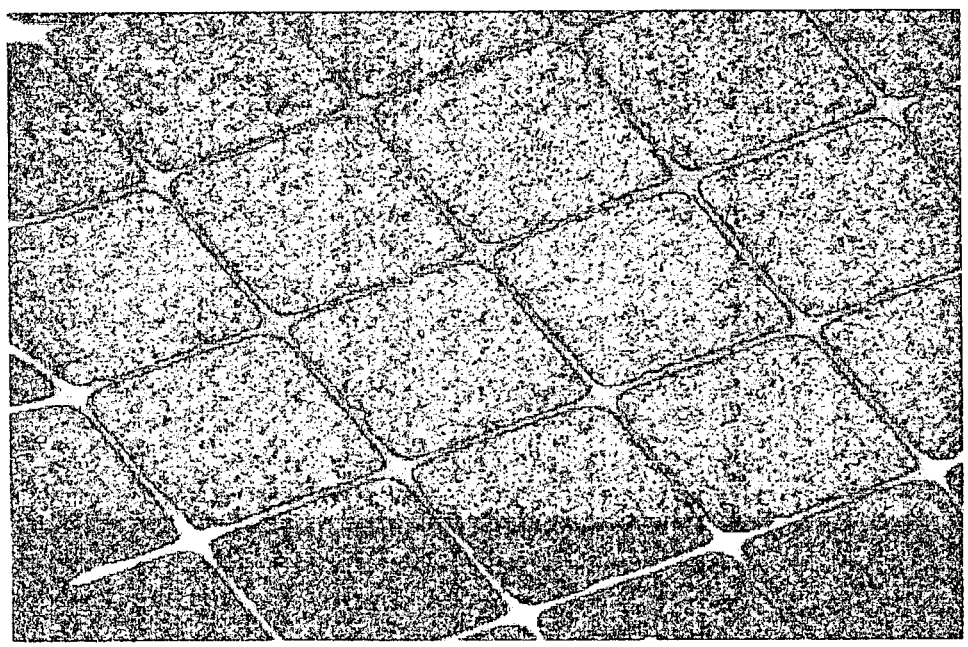
FIG. 12  100 μm

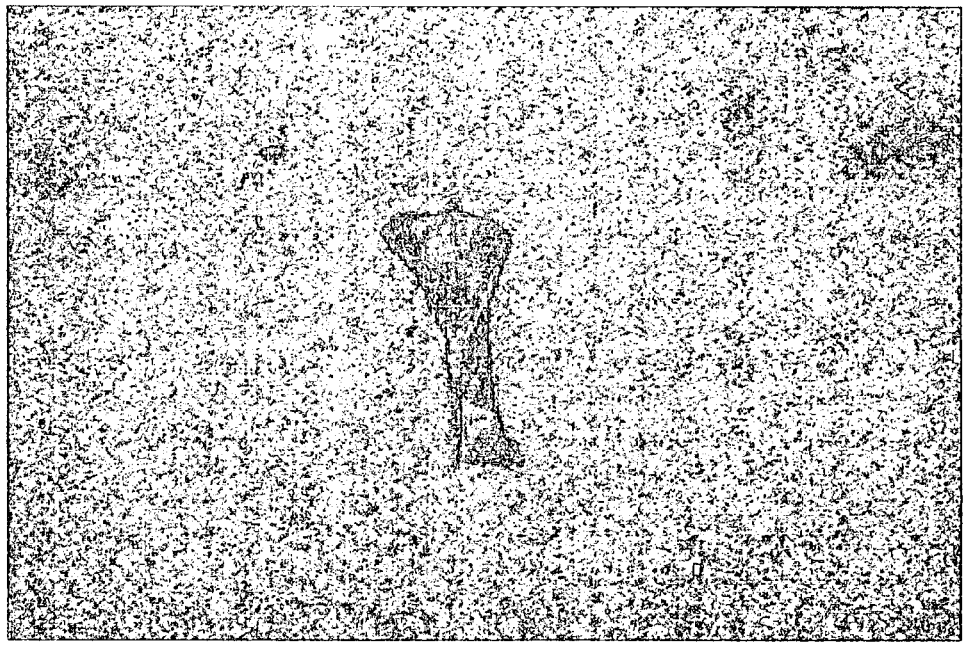
FIG. 13  10 μm
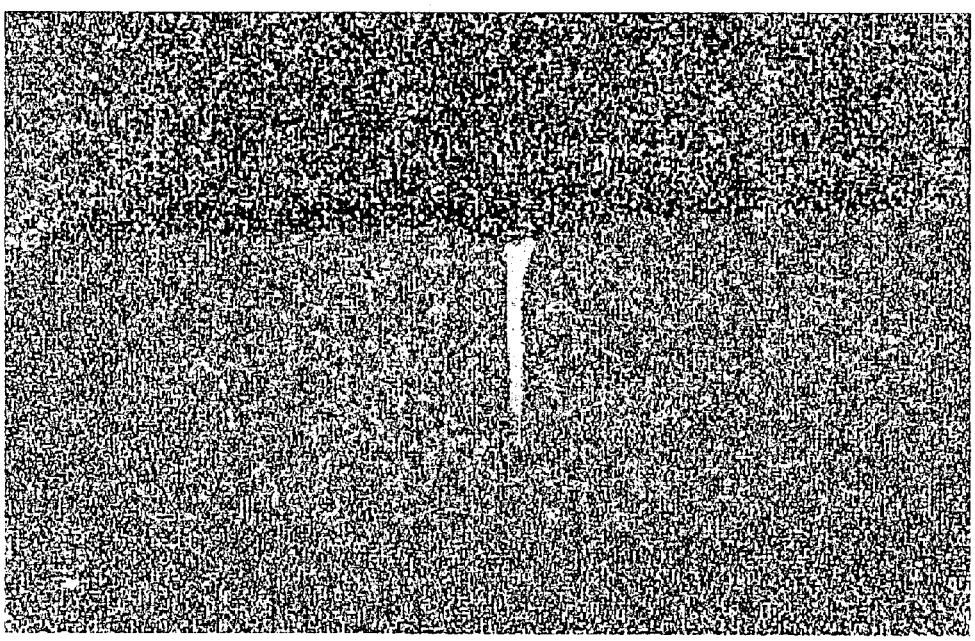
FIG. 14  10 μm

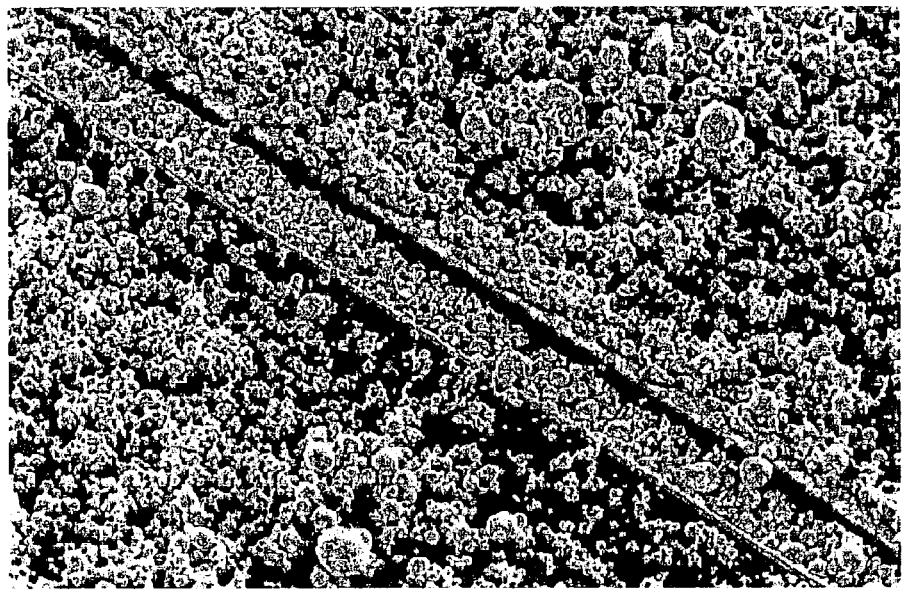
FIG. 15  10 μm
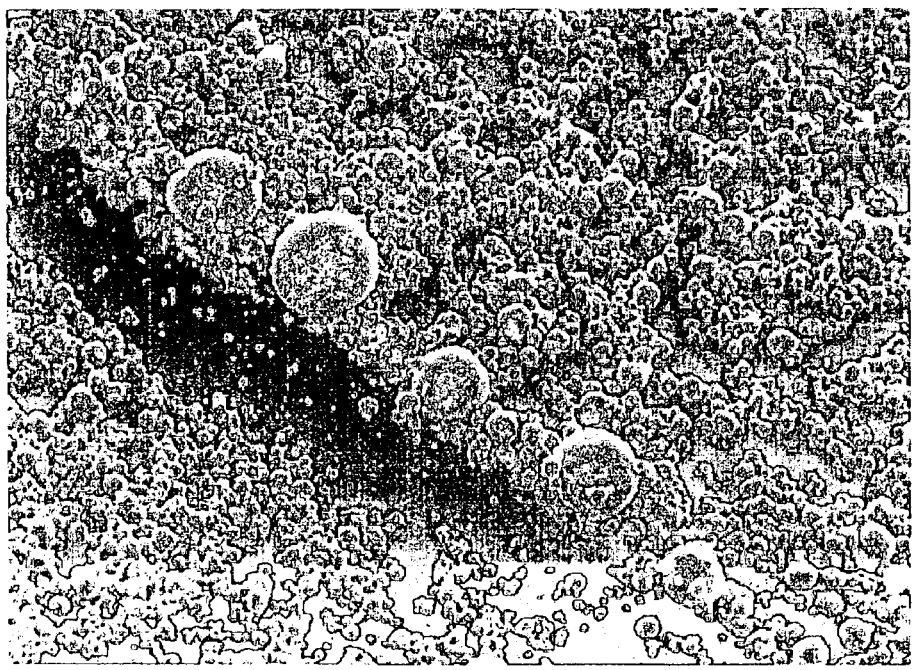
FIG. 16  10 μm

EMBEDDED ELECTRICAL TRACES

CROSS REFERENCE TO RELATED APPLICATION

This application is a divisional of U.S. application Ser. No. 09/941,058, filed Aug. 28, 2001, now issued as U.S. Pat. No. 6,591,496, the disclosure of which is herein incorporated by reference.

BACKGROUND

The present invention relates to fine, electrically conductive lines, grids or circuits embedded in a substrate and a method for making such devices. In one embodiment the conductive grid is sufficiently fine to be invisible to the unaided eye and the substrate is a transparent thermoplastic sheet. Transparent conductive sheets have a variety of uses including resistively heated windows, electromagnetic interference (EMI) shielding, static shielding, antennas, touch screens for computer displays, and surface electrodes for electrochromic windows and liquid crystal displays.

The use of essentially transparent electrically conductive grids for such applications as EMI shielding is well known. The grid can be formed from a network or screen of metal wires that are sandwiched or laminated between transparent sheets or embedded in substrates (U.S. Pat. No. 3,952,152; U.S. Pat. No. 4,179,797; U.S. Pat. No. 4,321,296; U.S. Pat. No. 4,381,421; U.S. Pat. No. 4,412,255). The disadvantage of using wire screens is the difficulty in handling very fine wires or in making and handling very fine wire screens. For example, a 20 micron diameter copper wire has a tensile strength of only 1 oz (28 grams force) and is therefore easily damaged. Wire screens fabricated with wires of 20 micron diameter are available but are very expensive due to the difficulty in handling very fine wire.

Rather than embed a preexisting wire screen into a substrate, a conductive pattern can be fabricated in situ by first forming a pattern of grooves or channels in a substrate and then filling the channels with a conductive material. This method has been used for making conductive circuit lines and patterns by a variety of means, although usually for lines and patterns on a relatively coarse scale. The grooves can be formed in the substrate by molding, embossing, or by lithographic techniques and then filling the grooves with conductive inks or epoxies (U.S. Pat. No. 5,462,624), with evaporated, sputtered, or plated metal (U.S. Pat. No. 3,891,514; U.S. Pat. No. 4,510,347; U.S. Pat. No. 5,595,943), with molten metal (U.S. Pat. No. 4,748,130), or with metal powder (U.S. Pat. No. 2,963,748; U.S. Pat. No. 3,075,280; U.S. Pat. No. 3,800,020; U.S. Pat. No. 4,614,837; U.S. Pat. No. 5,061,438; U.S. Pat. No. 5,094,811).

These prior art methods have significant limitations, however. For example, one problem with conductive inks or epoxies is that the electrical conductivity is dependent on the formation of contacts between adjacent conductive particles, and the overall conductivity is usually much less than that of solid metal. Vapor deposition of metal or electroplating is generally fairly slow and often requires a subsequent step to remove excess metal that is deposited between the grooves. Molten metal can be placed in the grooves but usually first requires the deposition of some material in the grooves that the metal will wet. Otherwise the molten metal will not penetrate nor stay in the grooves due to surface tension of the molten metal.

Circuits have been made by placing metal powder into grooves followed by compacting the powder to enhance electrical contact between the particles. Lillie et al. (U.S. Pat. No. 5,061,438) and Kane et al. (U.S. Pat. No. 5,094,811) have used this method to form printed circuit boards. However, the method as described by these inventors is not practical for making very fine circuits and metal patterns. The described method forms a pattern of channels in a substrate by embossing the substrate with a patterned tool, places metal powder in the channels, and then uses the same tool to compact the powder. On a fine scale, replacing or re-registering the tool over the embossed pattern to perform the metal compaction would be extremely difficult. For example, a sheet with a pattern of 20 micron wide channels would require that the tool be placed over the pattern to an accuracy of roughly 3 microns from one side of the sheet to the other. For many applications, the sheet may be on the order of 30 cm by 30 cm. Dimensional changes due to thermal contraction of a thermoplastic sheet are typically about 1% or more during cooling from the forming temperature to room temperature. Thus, for a 30 cm by 30 cm sheet, a contraction of 1% would give an overall shrinkage of 0.3 cm. This value is 1000 times larger than the 3 micron placement accuracy needed, making accurate repositioning of the tool impossible.

Alternatively, Lillie et al. (WO85/01231) have suggested placing a deformable material such as plastic over the powder and then applying pressure to the deformable material to compact the metal powder into the grooves. Jack et al. (U.S. Pat. No. 3,075,280) apply pressure to an elastomer sheet over a pattern of particle filled grooves. In these cases, a relatively high pressure must be exerted to the back side of the plastic or elastomeric layer to create sufficient hydrostatic pressure in the region of a groove to cause the compliant layer to press into the groove to compact the powder. Grooves that are deep relative to their width would particularly pose a problem. If the compliant layer is a soft plastic it will engulf the particles making it impossible to remove the compliant layer without removing at least some of the particles.

SUMMARY

The present invention is a method for making a fine electrically conductive grid embedded in a polymer substrate. The method includes the steps of providing a polymer substrate, forming a pattern of grooves in the substrate, filling the grooves with electrically conductive powder, and then applying heat and/or pressure to the substrate. The application of heat and/or pressure to the substrate causes the grooves to collapse inward against the conductive powder. Collapsing the grooves serves two purposes. First, it compacts the conductive powder within the groove, thereby establishing a continuously conductive grid line or circuit. Second, as the grooves collapse they become narrower. In applications where transparency is desirable, the narrower grid lines that result allow more light to transmit through the substrate. This inventive method allows grid lines to be made with higher aspect ratios (ratio of line depth to line width) than is possible by previous metal powder methods. The inventive method described herein also allows the fabrication of electrically conductive grids in the surface of materials, such as fluoropolymers, on which it is difficult to adhere metal.

In one embodiment of the invention, sufficient heat and pressure is applied to allow the polymer to completely engulf the compacted powder within the grooves. In this embodiment, the embedded powder becomes isolated from and protected from the environment. Alternatively, the polymer can be allowed to only partially engulf the conductive particles. In certain applications, exposing at least some of the particles at the substrate surface is desirable to allow electrical contact to the conductive grid material.

In another embodiment, the particles can be a metal or alloy that melts at a temperature lower than the temperature applied during the heating and/or pressure step. Normally, fine metal particles that are melted in absence of pressure will not easily coalesce together due to the presence of an oxide skin around the particles. Application of pressure causes the particles to deform sufficiently to break the oxide skin, thereby allowing the molten metal to coalesce and flow along the channels.

For a thermoplastic substrate, the grooves are induced to collapse by means of applying heat and pressure to the flat surface of the substrate. The compressive stress that is created within the body of the thermoplastic substrate distributes itself isostatically within the polymer and causes the grooves to collapse inward from the sidewalls and bottoms of the grooves. The collapsing sidewalls exert pressure on the particles, enhancing their electrical contact or, in the case in which the particles melt, breaking the oxide skin around the now molten particles allowing them to coalesce into a continuous electrical trace.

In a thermoset polymer the molecules are crosslinked, preventing plastic flow. However, conductive traces can still be embedded in the surface of a thermoset polymer substrate by making grooves in the polymer by means of a sharp tool that cuts into the surface. The regions of the polymer adjacent to the grooves retain residual stresses. When the polymer is heated these residual stresses cause the polymer groove to close up to near the original shape of the undisturbed polymer, entrapping any material that was placed into the groove and applying pressure to the material in the grooves. Although in many cases heat alone will collapse the grooves, the collapse can be enhanced by the application of pressure from a flat plate against the substrate. Most of the applied pressure in this case will be against the plowed up regions at the sides or edges of the grooves. In any case, the result is a conductive trace that is narrower than the original width of the groove and up to the same depth as the groove prior to its collapse.

BRIEF DESCRIPTION OF THE DRAWINGS

FIG. 1 is a scanning electron micrograph showing a polycarbonate sheet having an embossed pattern of grooves.

FIG. 2 is a scanning electron micrograph showing a polycarbonate sheet having an embossed pattern of grooves after the application of heat and pressure by a flat metal surface against the pattern of grooves.

FIGS. 6 and 7 are scanning electron micrographs of cross-sections of a groove in polyimide, before and after heating, respectively.

FIG. 8 is a scanning electron micrograph of a groove in polyetheretherketone (PEEK). The portion of the groove in the upper left part of the photograph has been heated to cause the groove to close up.

FIG. 9 is a scanning electron micrograph of a polycarbonate sheet with a pattern of partially collapsed grooves containing copper particles entrapped within the grooves.

FIG. 10 is a scanning electron micrograph of a cross section of a partially collapsed groove in polycarbonate that contains fine copper particles.

FIG. 11 is a scanning electron micrograph of some copper particles that are known as dendritic copper.

FIG. 12 is a scanning electron micrograph of a polycarbonate sheet with a pattern of a low melting ternary alloy of tin, bismuth and lead that has been melted and solidified under the pressure of a flat surface.

FIG. 13 is a scanning electron micrograph of a cross section of one of the grooves shown in FIG. 12.

FIG. 14 is a cross section of a metal line in polyimide.

FIG. 15 is a scanning electron micrograph of a particle-filled groove in PEEK.

FIG. 16 is a scanning electron micrograph of the particle-filled groove illustrated in FIG. 15 after heating.

DETAILED DESCRIPTION

An embossed substrate comprising a polycarbonate sheet is shown in FIG. 1. The embossed grooves can be formed, for example, by hot embossing a flat substrate against a patterned die, by casting hot polymer resin against a patterned die, or by cutting into the surface with a sharp tool. The substrate can be selected from any family of materials that flow under the application of pressure, the application of heat, or the combined application of heat and pressure. Preferred substrates include any thermoformable or thermoplastic polymer, and may include elastomeric materials. The substrate may be a fluoropolymer, including perfluorinated and partially fluorinated polymers. For selected applications, it may be preferred that the substrate is transparent.

As shown in FIG. 2, when the polycarbonate substrate shown in FIG. 1 is subjected to heat and pressure the embossed grooves partially collapse. When pressure is applied in a direction normal to the flat surface of the polymer substrate, the walls of the grooves collapse inward and the bottoms of the grooves collapse upward. The collapsing of the grooves is illustrated schematically in FIG. 3 and explained in greater detail below.

Figure 3:
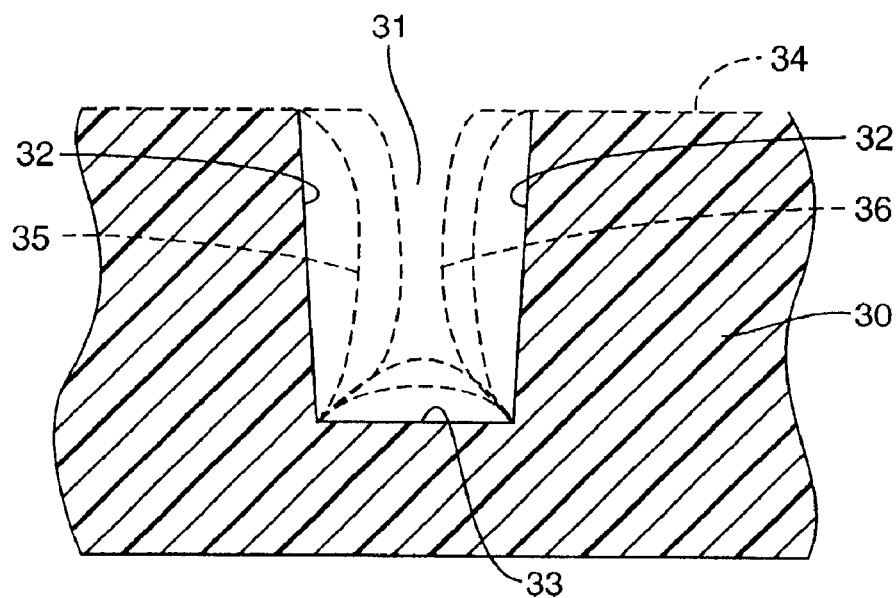
FIGS. 3, 4, and 5 are cross sectional drawings of grooves showing how they collapse under compression of the substrate by a flat plate.

As seen in FIG. 3, a polymer substrate 30 has a groove 31 with a generally rectangular cross-section. Groove 31 is defined by side walls 32 and bottom surface 33. As pressure is applied to flat surface 34 of the substrate 30, the original generally rectangular cross-section of groove 31 begins to deform, with side walls 32 and bottom surface 33 collapsing inward. After a moderate amount of collapse of the side walls 32 and bottom surface 33, groove 31 has a cross-sectional profile as illustrated by dashed line 35. Increased time, heat, and/or pressure results in groove 31 having a cross-sectional profile as illustrated by dashed line 36. Ultimately, in the absence of any foreign material in the groove 31, groove 31 will collapse shut completely. If groove 31 is sufficiently deep relative to its width, the side walls 32 of groove 31 will ultimately contact each other during the collapse.

Figure 4:
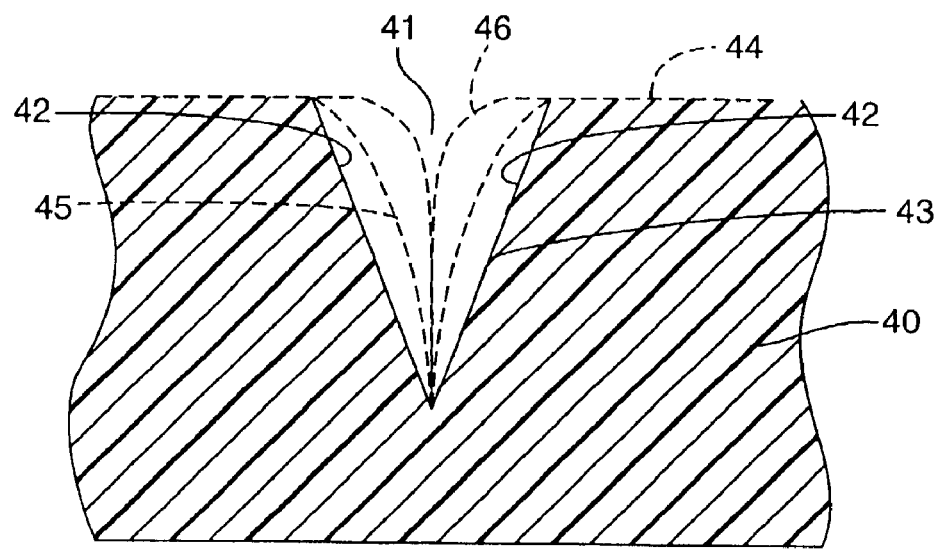

FIG. 4 is a cross-sectional illustration of a polymer substrate 40 having a groove 41 with a triangular cross section. If the groove 41 is formed by hot embossing or casting of a thermoplastic polymer substrate 40, the side walls 42 of groove 41 will collapse in the manner shown in FIG. 4. That is, if the polymer substrate 40 has original triangular cross-section 43 before the application of heat and pressure, then the application of heat, pressure, and time on flat surface 44 of substrate 40 will cause the side walls 42 of groove 41 to collapse first to the profile of dashed line 45, and then with additional heat, pressure or time, to the profile of dashed line 46.

Figure 5:
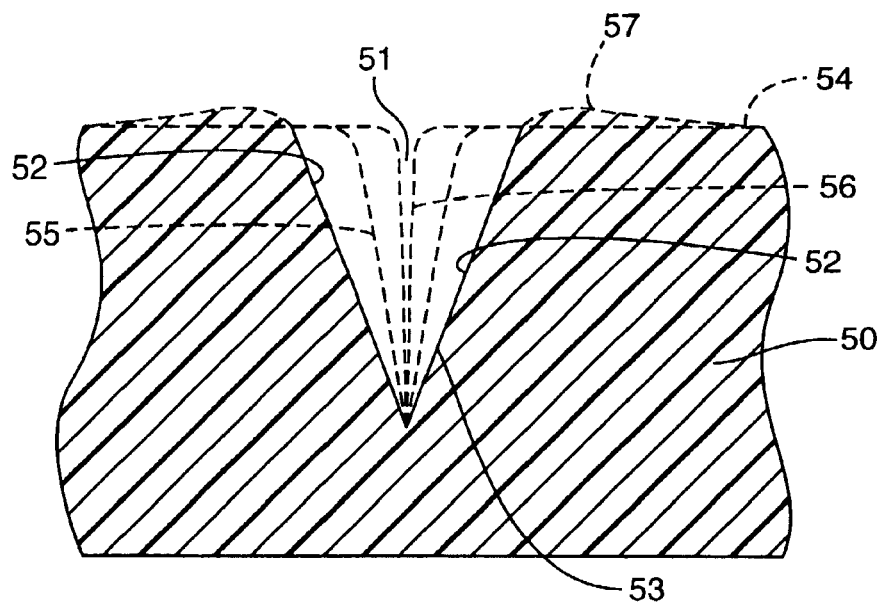

With a sharp embossing tool and sufficient pressure, grooves with triangular cross-sections can be formed below the glass transition temperature of the polymer substrate, even in cross-linked polymers such as polyimide or epoxy. In this case, the groove will usually collapse as illustrated in FIG. 5. As seen in FIG. 5, the polymer substrate 50 has groove 51 with side walls 52. Side walls 52 form triangular cross-section 53. When heat and/or pressure are applied to the originally flat surface 54 of the polymer substrate 50, the side walls 52 of groove 51 collapse toward the profile of dashed line 55 and then, with additional heat and pressure, toward the profile illustrated by dashed line 56. When groove 51 is formed by compressing the substrate against a sharp tool (not shown). There will often be a raised or plowed up edge 57 next to the groove 51. These plowed up edges 57 and the polymer adjacent groove 51 have stored residual stresses. With the application of heat, the residual stresses are relieved as the substrate 50 moves or flows toward its original shape. This effect can occur with the application of heat alone.

Figure 6:
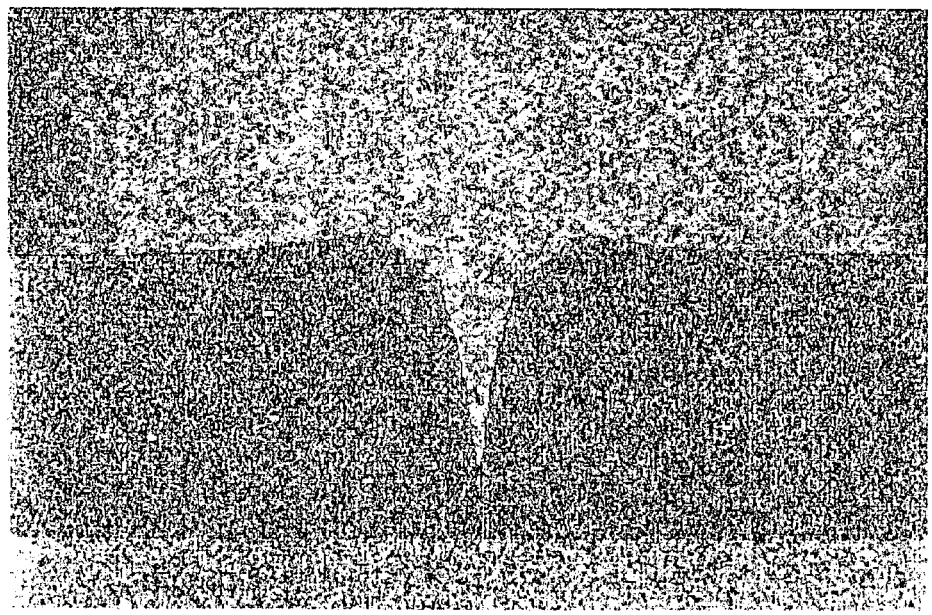

FIGS. 6 and 7 are scanning electron micrographs of cross-sections of a groove in polyimide that has been embossed at room temperature with a sharp tool (FIG. 6) and then heated (FIG. 7) without any application of pressure. FIG. 8 is a scanning electron micrograph showing a groove in a polyetheretherketone (PEEK) substrate that was formed at room temperature by lightly drawing a razor blade across the surface of the substrate. The portion of the groove shown in the upper left hand corner of the micrograph was then heated without applying any external pressure to the substrate. When heated in the absence of pressure, the groove closes up to close to its original shape, forming a narrow slit in place of the groove.

FIG. 9 shows copper particles retained in a partially collapsed pattern of grooves in a polycarbonate sheet. As described in the examples below, the grooves are filled with metal particles prior to the application of heat and pressure. Particles are most easily placed within the grooves by well-known methods such as knife coating or smearing slurries composed of a volatile liquid plus the particles over the grooved substrate. Such coating methods usually result in particles completely covering the grooves and the flat regions between the grooves. If the grooves are sufficiently deep relative to the size of the particles and if the aspect ratio (depth vs. width) of the grooves is greater than approximately 1, then the excess particles remaining on the flat areas between the grooves can be simply wiped off without disturbing the particles positioned within the grooves.

When heat and/or pressure are applied to the substrate, the particles in the grooves become entrapped and engulfed by the polymer substrate. The sides and bottoms of the grooves deform as described above and press against the particles, thereby causing the particles to compact against each other and enabling reliable electrical contact between the particles. For best compaction, the temperature during compaction should be only slightly above the softening point of the polymer and the pressure should be relatively high. In this way, the walls of the grooves have sufficient stiffness to force the particles together without the polymer simply flowing around the particles.

The degree to which the grooves collapse can be controlled for the intended application of the finished product. For example, only partially collapsing the grooves results in the particles being exposed at the surface of the substrate (like the particles shown in FIG. 9), which in turn enables easy electrical contact to the line pattern of compacted particles. With the application of additional time, heat, and pressure, the particles can become completely engulfed by the polymer substrate. In some applications complete engulfing of the particles within the substrate is desirable due to the enhanced abrasion resistance, corrosion resistance and oxidation resistance afforded by the protective layer of polymer around the particles. In some applications, it may be further desirable to laminate another layer of a polymer against the embedded particle filled pattern in order to provide even greater protection of the metal by the polymer. In a preferred embodiment, the thickness of this second protective polymer layer can be selected so as to place the metal pattern at the mid-thickness plane of the laminated construction. A pattern of metal lines at the mid-thickness plane would not be as adversely affected by detrimental tensile stresses (such as those induced by bending the substrate) as compared to a pattern on or close to the surface of the substrate during bending of the construction.

The size of the particles relative to the groove is important. It is desirable to have an average particle size that is small relative to the groove width. It is also desirable to have a particle size distribution that reduces the creation of voids between the particles as they compress together in a limited space. Ideally, the particle size should be between about $\frac{1}{4}$ to $\frac{1}{10}$ the width of the grooves. However, if the particles are too fine, they will become captured between the pressing plate and the polymer at the edge of the grooves during the application of heat and pressure. This effect increases the effective width of the metal lines, which reduces the amount of light that can transmit through the metal/polymer construction. FIG. 10 shows scanning electron micrograph of a cross-section of a collapsed groove that was filled with overly fine particles (0.02 micron diameter copper) before the application of heat and pressure. The regions labeled 81 are thin areas of metal particles that have been trapped between the pressure plate and the polymer during collapse of the groove. As can be seen from examining FIG. 10, the regions 81 increase the apparent width of the metal lines.

The shape of the metal particles has some effect on the conductivity and mechanical strength of the metal lines. An especially desirable type of particles known as dendritic copper particles, shown in FIG. 11, are formed by electroplating at high current densities to give a very irregular fern-like shape that has many fingers. The fingers of adjacent particles interlock during the application of pressure to give superior mechanical strength and improved electrical conductivity with many contact points.

Although metal particles are described above, it should be noted that the particles can be composed of any suitable conductive particles, including metal, organic and inorganic particles. For metals, high conductivity metals such as copper or silver are desirable. Alternatively, ductile metals such as tin are also desirable because they can deform under sufficient pressure to form enhanced electrical contacts between adjacent particles. The particles may also be photoconductive particles, such as selenium. In a preferred embodiment, the metal particles can be composed of a metal or alloy that melts during the application of heat and pressure.

In the absence of applied pressure, most loose metal particles will not coalesce during melting due to the constraining effect of the oxide layer or skin that surrounds each particle. This is especially true of low-melting elemental metals and alloys of tin, bismuth, lead, indium, antimony, zinc, and aluminum. Normally, it is necessary to heat particles of these metals in the presence of a solder flux to induce them to coalesce. An example of such a flux is a powdery anhydride of a carboxylic acid, which has particle sizes small enough to occupy space between the larger metallic particles. However, if the metal particles are sufficiently deformed while melting, the oxide skin will break and allow the molten metal to flow and coalesce into continuous lines of metal without the need for a solder flux.

FIG. 12 shows a grid of an alloy of tin, bismuth, and lead that was formed by filling a grooved polycarbonate sheet similar to that of FIG. 1 and then compressing the substrate with a flat plate at a temperature sufficient to melt the metal. FIG. 13 shows a cross section of one of the grid lines of FIG. 12. A polymer/metal construction of a pattern of metal lines of low melting metal in a thermoplastic that deforms above the melting point of the metal can have some thermoformability without the loss of electrical conductivity. This is especially true if the metal pattern is overcoated with additional thermoplastic material to constrain the molten metal from coming out of the grooves during thermoforming.

Mixtures of higher melting powders such as copper with lower melting powders such as tin-bismuth can be beneficial. The copper is more electrically conductive than the tin-bismuth but the tin-bismuth will melt and fill in the voids that might otherwise be present in the pressed copper powder alone. Even if the tin-bismuth does not wet the copper without the aid of solder fluxes, it still enhances the electrical conductivity by filling voids which may be present. In addition, when mixed with dendritic copper particles it enhances the mechanical strength of the electrical trace by encapsulating the irregular fern-like fingers and projections of the dendritic copper particles. The presence of non-melting particles such as copper can also provide some control over the amount of collapse of the grooves under heat and pressure. Unconstrained molten metal does not offer much resistance to the collapse of the side walls of the grooves, and the grooves could collapse completely with the application of too much time, heat and pressure. Solid particles can help to prevent complete collapse.

FIG. 14 shows a cross-section of a metal trace in polyimide formed by filling a groove with metal particles of tin-bismuth-lead alloy and then heating the polyimide to melt the metal and to cause the groove to collapse, entrapping at least part of the metal. The trace is roughly 10 microns deep and between 1 and 2 microns wide. FIG. 14 illustrates the electrical trace fineness that may be achieved using the methods of this invention.

Figure 17:
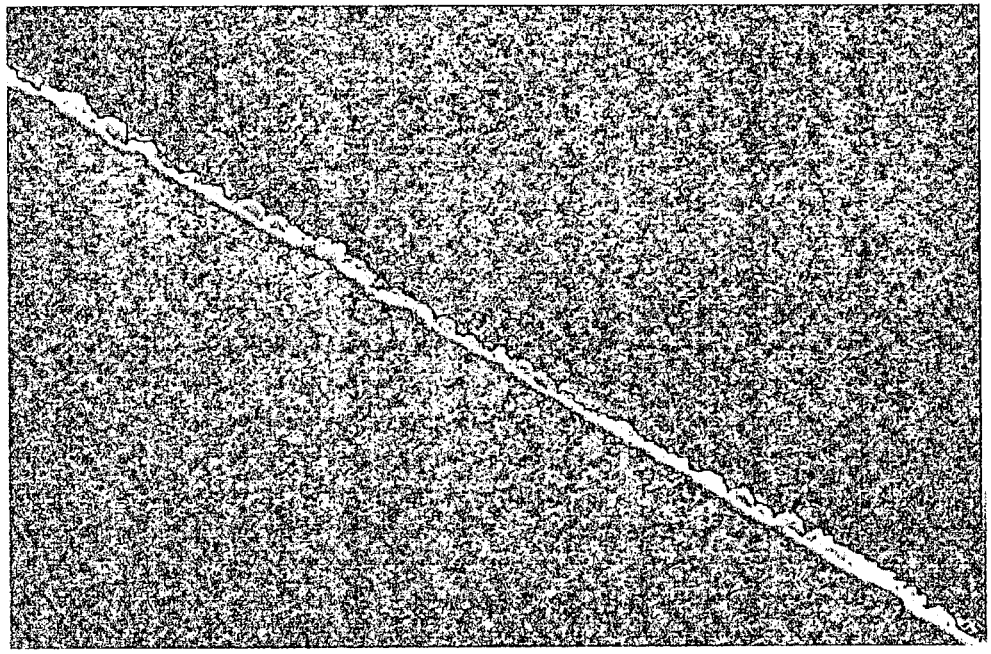
FIG. 17 is a scanning electron micrograph of the particle-filled groove of FIGS. 15 and 16 after excess particles have been wiped away.

FIG. 15 shows a groove in PEEK (similar to the unheated part of the groove shown in FIG. 6), after the groove was flooded with particles of tin-lead and tin-bismuth. When the groove is closed with heat alone, it is not necessary to remove the excess particles in the region between the grooves prior to heating the substrate. Leaving excess particles on the substrate helps to prevent possible loss of particles from the grooves that often occurs during a cleaning or wiping step. During heating, excess metal is forced out of the groove as the groove closes up, forming periodic beads of metal along the groove as shown in FIG. 16. Part of the metal is left in the groove to form an electrically conductive trace, while some of the metal stays within the groove due to the fact that the metal wets its own oxide. The original oxide skins of the particles tend to stick in the grooves and help anchor the molten metal. The beads that form outside the grooves and the excess particles between the grooves can be removed for reuse by brushing or wiping. The resulting metal trace is shown in FIG. 17.

If the original groove is relatively narrow it can be more easily and efficiently filled with metal particles by brushing or wiping the particles over the substrate while the substrate is bent around a cylindrical surface parallel to the groove to open up the top of the groove more completely. It is preferred that very narrow slit-like grooves be filled in this manner to ensure an adequate volume of metal particles is present in the groove.

Figure 18:
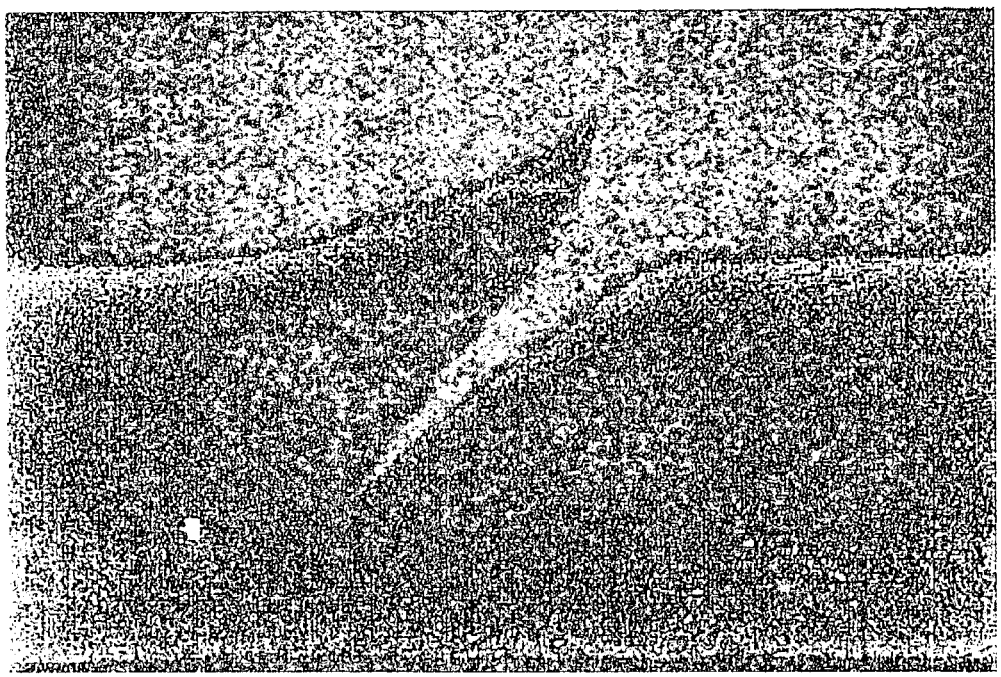
FIG. 18 is a scanning electron micrograph of a cross section of a slanted groove in polyimide.
Figure 19:
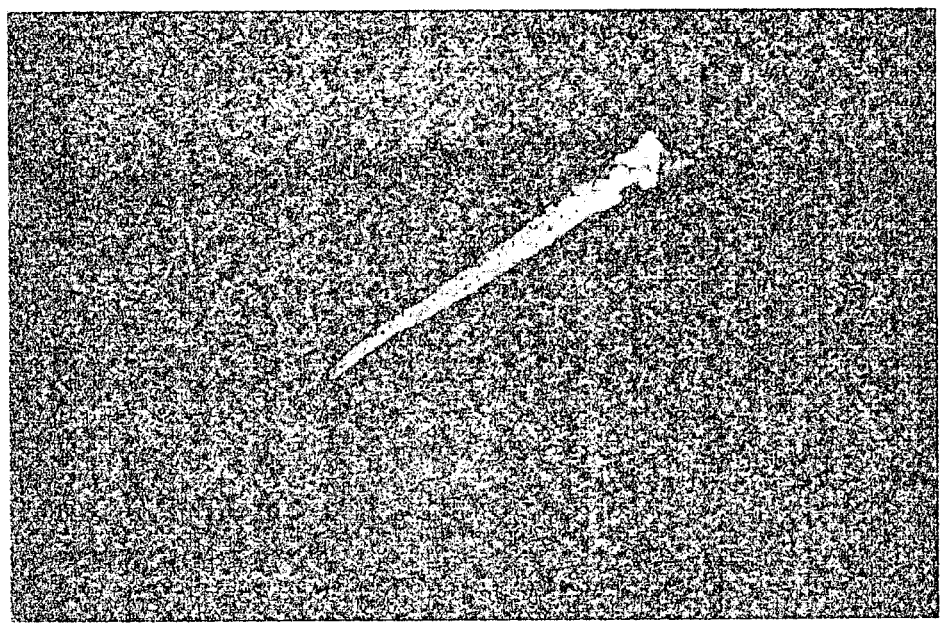
FIG. 19 is a scanning electron micrograph of a cross section of a groove in polyimide similar initially to that shown in FIG. 1. The groove was filled with SnBi/SnPb particles and heated. The excess particles were then wiped away.

In some applications, there may be benefit to having the grooves and the resulting electrical trace profiles oriented at an angle of less than 90° from the surface of the substrate, as shown in FIG. 18. One benefit of a non-orthogonal orientation is the opportunity to make a deeper trace than might be possible otherwise due to thickness limitations of the substrate. There might also be optical applications in which the maximum light transmission is desired to be at some angle defined by the trace profile. In addition, a groove with an angled depth profile might be easier to fill with particles, especially if the plowed up edge on one side of the groove is thicker than that on the other. This projecting edge can aid in the collection of particles that are wiped in a direction against the projection edge. FIG. 18 shows a cross section of a groove cut into the surface of a polyimide substrate by use of a razor blade held at an angle and not perpendicular to the substrate. FIG. 19 shows a cross section of an electrical trace formed using an angled groove.

EXAMPLES

The following examples illustrate the use and application of the invention described above. The examples are exemplary and not intended to be limiting in their description.

Example 1

A 25 cm by 25 cm by 0.15 cm electroformed nickel tool having a square pattern of ridges 25 microns wide by 25 microns high and 125 microns pitch was used to emboss a 25 cm by 25 cm by 250 micron piece of polycarbonate (Lexan 8010MC obtained from Plastic Films Co., Schiller Park, Ill.). The embossing was done in a Wabash press capable of providing 50 tons of force over a 46 cm by 46 cm area. The polycarbonate was embossed by placing the polycarbonate sheet against the nickel tool on one side and a piece of 2 mil thick polyimide (Kapton®) on the other side. A piece of 25 cm by 25 cm by 0.3 cm silicone rubber sheet was placed on the other side of the polyimide sheet and the assembly of nickel tool, polycarbonate, polyimide, and silicone rubber was placed between two 25 cm by 25 cm by 1.3 cm steel plates and then placed in the hot press. The press was pressurized to 8 tons (equivalent over the 100 sq in sample area to 160 psi=1.1 Mpa) and heated from room temperature to 182° C. over a period of 15 minutes. The press was then cooled back to room temperature by passing water through its platen cooling tubes, a process that took approximately 8 minutes. The pressure was released and the polycarbonate sheet removed from the press. The resulting pattern is shown in FIG. 1.

Copper powder was obtained from Atlantic Equipment Engineers, Inc. (# Cu110 1–5 microns). To screen out the larger particles, about 20 g of the copper powder were added to 250 ml of water, shaken, and allowed to settle in a graduated cylinder for 1 minute. The water and fine copper particles were poured out, leaving behind the coarser particles at the bottom of the cylinder. The fine particles were rinsed in 0.1 N HCl to remove their oxide layers, and two more rinses of water, each time letting the particles settle to the bottom of a beaker for 5 minutes. One final rinse was done with about 10 ml of methanol.

A mixture of 0.5 g of this fine copper powder and 1 ml of methanol were spread over the surface of the patterned polycarbonate. The slurry was spread with a 5 cm by 10 cm piece of cotton cloth folded to form a 5 cm by 5 cm piece. The slurry was spread back and forth diagonally to the square pattern of grooves in the polycarbonate until the grooves were completely covered with the slurry. As the methanol evaporated, the cloth picked up the excess particles from the land areas. This process took about 15 to 30 seconds. There is a time during which the methanol from the land areas of the pattern has completely evaporated or soaked into the cloth and any excess particles are swept clean from the land areas. If the sweeping motion is continued, the methanol also dries out of the grooves and at this point the cloth also starts to pick up the particles in the grooves. It is necessary to stop the sweeping motion before this happens.

The particle filled polycarbonate sheet was then sandwiched between two pieces of 2 mil thick polyimide and this assembly in turn was sandwiched between two pieces of ⅛" thick silicone rubber and placed in turn between two ½" thick steel plates and put back into the hot press. Five tons of force (100 psi=680 kpa over the sample) were applied. The hot press was heated to 340° F. (171° C.) over a period of 15 minutes at which time the press was then cooled back to room temperature by means of water passing through the cooling channels of the platens, a process that took an additional 7 minutes.

To roughly measure the sheet resistivity, a probe was made from two pieces of #18 copper wire, individually wrapped around a 0.63 cm by 5 cm by 1.3 cm piece of glass so that the wires were space 1.3 cm apart, forming a square 1.3 cm by 1.3 cm on the 1.3 cm wide face of the glass. The wires were held in place with epoxy. The probe face was gently sanded with #320 grit sandpaper to insure flatness and remove excess epoxy.

The resistance of the embedded mesh pattern on the polycarbonate measured about 0.3 ohms/square at the center of the sample and about 1 ohm/square within 5 cm of the edge. Within 2.5 cm of the edge the resistance increased dramatically to greater than 30 Megohms.

Example 2

A copper particle filled grid on polycarbonate was prepared in a manner identical to that of Example 1, except that the copper particles were obtained from Aldrich and were labeled "35,745-6, dendritic 3 micron." Some of these particles are illustrated in FIG. 11. They were sieved through a #635 stainless steel sieve to remove any larger particles. The hot pressing temperature was 180° C. The resulting sample had a surface resistivity of about 1 ohm/square. A 2.5 cm by 15 cm wide strip of this sample was drawn 180° around a 4 mm radius with the patterned side out. The resistivity was remeasured. It increased by a factor of about 1.5 to 2. The sample of Example 1 was also drawn through a radius in the same manner. The resistivity increased by a factor of 3 to 5.

Example 3

A sheet of polycarbonate was patterned, filled with powder, and hot pressed in a manner identical to that of Example 1, except that a 50—50 (by weight) mixture of tin-bismuth eutectic powder and tin-lead eutectic powder was used instead of copper particles. The tin-bismuth eutectic powder had been made by blowing a molten stream of eutectic tin-bismuth out of a nozzle against several high velocity streams of hot nitrogen gas to break up the molten jet into very fine particles. The particles were sieved through a #635 stainless steel mesh. The tin-lead eutectic powder was obtained from Sherritt (type 6501 63 Sn37Pb-10 micron). No attempt was made to remove the oxide coating of the particles before smearing them into the pattern on the polycarbonate sheet. The resulting sheet resistivities were about 2–5 ohms per square.

Example 4

A sheet of polycarbonate was patterned in a manner identical to the method of Example 3, except that the powder consisted of a mixture of the copper powder of Example 1, the Sn—Bi/SnPb powder of Example 3 and some fine tin powder (AEE type SN-101, 1–5 micron) in a proportion of 1:1:1 by weight. During hot pressing the tin-based powders melted. In this case the copper powder serves to increase the electrical conductivity and while the tin-based powder becomes molten and flows to fill the voids between the copper particles, increasing the mechanical strength of the electrical trace. However, the molten metal did not appear to wet the copper particles. The resulting sheet resistivity was between 1 and 2 ohms per square.

Example 5

A sheet of polycarbonate was patterned, filled with copper powder, and hot pressed in the same manner as Example 1. In this example, the copper particles in the flat areas between the grooves were wiped aggressively enough to remove much of the powder in the grooves. The sample had a measured initial resistance of more than 1 k ohm/square in the center of the sample to more than 1 Megohm/square on the outer regions of the sample. A portion of this material was then catalyzed by inserting it into an acidic palladium chloride solution and followed with plating in an electroless copper bath (Lea Ronal Cu-872) for 4 minutes at 60° C. Following copper plating, there was a uniform sheet resistivity of 2.5 ohms/square.

Example 6

A conductive grid of copper particles was patterned into Teflon FEP in a manner similar to the method of Example 1, except that the hot pressing temperature was 204° C., to pattern the Teflon and to hot press to form the conductive grid. The resulting patterned substrate had a sheet resistivity of about 0.5 to 1 ohm per square.

Example 7

An electroformed nickel tool was pressed against a 15 cm by 20 cm piece of 127 micron thick polyimide (Dupont Kapton® H film) with a pressure of 3.4 MPa averaged over the 300 cm² area of the polyimide. The electroformed tool had a square pattern of sharp, triangular cross-section ridges with an internal angle of 35°, ridge height of 300 microns and width of the ridge at the base of 190 microns. The ridges had a pitch (distance between the ridges) of 1.27 mm. Under the 3.4 MPa pressure, the ridges of this tool did not completely penetrate the polyimide substrate, but created a square pattern of grooves 40 microns wide and 70 microns deep. A cross section of the resultant groove is shown in FIG. 6. The SnBi/SnPb powder used in Example 3 was placed into the grid of grooves in the polyimide by dusting the powder over the surface of the polyimide using a camel's hair artist brush. The substrate was then heated to 300° C. for about 10 seconds by placing the substrate on a hot plate. The grooves in the polyimide closed up. Excess molten metal was extruded from the grooves in the form of beads spaced along the grooves. These beads and the excess metal powder was wiped from the surface of the polyimide using a damp cotton cloth. The resulting metal lines had a resistance of roughly 1 k Ohm/cm. A cross section of one of these lines is shown in FIG. 14.

Example 8

A piece of PEEK film 5 cm by 12 cm by 250 microns was taped to the flat weighing surface of an Ohaus GT8000 microbalance. A razor blade was hand held perpendicular to the substrate but with the sharp edge held at approximately 20° from the substrate and drawn across the surface of the PEEK parallel to the blade to create a triangular cross-section groove in the surface of the PEEK. The downward force measured on the microbalance during application of the razor blade was 60 grams. The same mixture of fine tin-lead and tin-bismuth powder used in Example 3 was applied to the surface of the PEEK film and brushed across the surface perpendicularly to the groove. The surface was then gently heated with a propane torch set to a low flame (about 1 cm inner blue cone of the flame), and passed (about 4 cm/sec) over the surface above the groove in order to heat the groove above the melting point of the metal powder. The heat was not sufficient to crystallize the PEEK. The excess metal powder was wiped away using a cotton cloth moistened in methanol. The resulting metal line had a resistance of about 200 ohms per cm. The appearance of the line during these process steps is shown in FIGS. 15–17.

Example 9

A groove was formed in a piece of 20 micron thick polyimide (Dupont Kapton® H film) in a manner similar to that of Example 8 except that instead of holding the razor perpendicular to the substrate, the razor was held at a sideways angle of 45 degrees in order to make a groove that slanted roughly 45° from the surface of the substrate. The downward force on the razor blade was about 40 g. The resulting cross-section of the groove is shown in FIG. 18. The groove was filled with tin-bismuth and tin-lead powder in a manner similar to that of Example 8 except that the powder was brushed toward the sharp edge of the plowed up edge beside the groove. In this way the plowed up edge helped to capture the particles into the groove. After heating to melt the particles and to close up the groove, the resulting electrical trace had a resistance of 200 ohms /cm. FIG. 19 shows an electron micrograph of the resulting cross-section.

While the invention may be adaptable to various modifications and alternative forms, specific embodiments shown and described herein by way of example only. It should be understood that the invention is not intended to be limited to the particular forms disclosed. Rather, the invention is to cover all modifications, equivalents and alternatives falling within the spirit and scope of the invention as defined by the appended claims. Moreover, the different aspects of the disclosed structures and methods may be utilized in various combinations and/or independently. Thus the invention is not limited to only those combinations shown herein, but rather may include other combinations.

What is claimed is:

1. An electrically conductive sheet material comprising:
   a polymer substrate;
   a pattern of metal traces in channels of the substrate, the metal traces retained compressively by inwardly collapsed walls of the channels in the substrate.
2. The electrically conductive sheet material of claim 1, wherein the trace is less than 2 microns wide.
3. The electrically conductive sheet material of claim 1, wherein the trace has a ratio of depth to width of greater than 5.
4. The electrically conductive sheet material of claim 1, wherein the trace has a ratio of depth to width of greater than 10.
5. The electrically conductive sheet material of claim 1, wherein the metal traces are photo-conductive.
6. The electrically conductive sheet material claim 5, wherein the photoconductive metal traces comprise selenium.
7. The electrically conductive sheet material of claim 1, wherein the polymer substrate is a thermoformable material.
8. The electrically conductive sheet material of claim 1, wherein the polymer substrate is an elastomeric material.
9. The electrically conductive sheet material of claim 1, wherein the channels have a triangular cross section.
10. The electrically conductive sheet material of claim 1, wherein the metal is selected from the group of copper, tin, silver, lead, or bismuth.
11. The electrically conductive sheet material of claim 1, wherein the substrate is a fluoropolymer.
12. The electrically conductive sheet material of claim 1, wherein the substrate is a perfluorinated polymer.
13. The electrically conductive sheet material of claim 1, wherein the substrate is a partially fluorinated polymer.

* * * * *

UNITED STATES PATENT AND TRADEMARK OFFICE
CERTIFICATE OF CORRECTION

PATENT NO. : 6,929,849 B2 Page 1 of 1
APPLICATION NO. : 10/442396
DATED : August 16, 2005
INVENTOR(S) : David C. Koskenmaki It is certified that error appears in the above-identified patent and that said Letters Patent is hereby corrected as shown below:

Column 12, Claim 6
Line 32, after "material" insert -- of --.
Line 33, delete "photoconductive" and insert in place thereof -- photo-conductive -- .

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 6,929,849 B2 Page 1 of 1
APPLICATION NO. : 10/442396
DATED : August 16, 2005
INVENTOR(S) : David C. Koskenmaki It is certified that error appears in the above-identified patent and that said Letters Patent is hereby corrected as shown below:

Column 12, Claim 6
Line 32, after "material" insert -- of --.
Line 33, delete "photoconductive" and insert in place thereof -- photo-conductive --.

Signed and Sealed this

Twenty-seventh Day of March, 2007

JON W. DUDAS
*Director of the United States Patent and Trademark Office*